United States Patent
Hung et al.

(10) Patent No.: US 8,977,912 B2
(45) Date of Patent: Mar. 10, 2015

(54) METHOD AND APPARATUS FOR REPAIRING MEMORY

(75) Inventors: Chun-Hsiung Hung, Hsinchu (TW);
Han-Sung Chen, Hsinchu (TW);
Nai-Ping Kuo, Hsinchu (TW);
Su-Chueh Lo, Miaoli (TW)

(73) Assignee: Macronix International Co., Ltd., Hsinchu (TW)

( * ) Notice: Subject to any disclaimer, the term of this patent is extended or adjusted under 35 U.S.C. 154(b) by 712 days.

(21) Appl. No.: 11/745,244

(22) Filed: May 7, 2007

(65) Prior Publication Data

US 2008/0282107 A1    Nov. 13, 2008

(51) Int. Cl.
| | | |
|---|---|---|
| *G11C 29/24* | (2006.01) | |
| *G11C 29/56* | (2006.01) | |
| *G11C 29/00* | (2006.01) | |
| *G11C 29/54* | (2006.01) | |

(52) U.S. Cl.
CPC .......... *G11C 29/56* (2013.01); *G11C 29/56008* (2013.01); *G11C 29/88* (2013.01)
USPC ......................................... 714/710; 714/718

(58) Field of Classification Search
None
See application file for complete search history.

(56) References Cited

U.S. PATENT DOCUMENTS

| | | | |
|---|---|---|---|
| 4,628,509 A | 12/1986 | Kawaguchi | 714/711 |
| 5,410,687 A | 4/1995 | Fujisaki et al. | 365/201 |
| 5,530,805 A | 6/1996 | Tanabe | 714/42 |
| 5,666,049 A | 9/1997 | Yamada et al. | 324/158.1 |
| 5,754,556 A | 5/1998 | Ramseyer et al. | 714/711 |
| 5,758,056 A | 5/1998 | Barr | 714/7 |
| 5,790,559 A | 8/1998 | Sato | 714/720 |
| 5,844,850 A | 12/1998 | Tsutsui et al. | 365/200 |
| 5,917,764 A | 6/1999 | Ohsawa et al. | 365/200 |
| 5,978,949 A | 11/1999 | Terayama et al. | 714/738 |
| 6,009,028 A | 12/1999 | Akiyama et al. | 365/201 |
| 6,115,828 A | 9/2000 | Tsutsumi et al. | 714/7 |
| 6,154,862 A | 11/2000 | Tabata et al. | 714/719 |
| 6,157,200 A | 12/2000 | Okayasu | 324/753 |
| 6,158,037 A | 12/2000 | Oshima | 714/743 |
| 6,275,058 B1 * | 8/2001 | Lunde et al. | 324/765 |
| 6,442,724 B1 | 8/2002 | Augarten | 714/738 |
| 6,457,148 B1 | 9/2002 | Yoshiba | 714/718 |
| 6,477,672 B1 | 11/2002 | Satoh | 714/721 |
| 6,532,182 B2 | 3/2003 | Ogawa et al. | 365/201 |
| 6,532,561 B1 | 3/2003 | Turnquist et al. | 714/738 |
| 6,594,788 B1 | 7/2003 | Yasui | 714/710 |
| 6,611,467 B2 * | 8/2003 | Dean | 365/201 |
| 6,650,583 B2 | 11/2003 | Haraguchi et al. | 365/201 |
| 6,708,295 B2 | 3/2004 | Fujiwara | 714/45 |
| 6,711,705 B1 | 3/2004 | Yasui | 714/723 |
| 6,718,487 B1 | 4/2004 | Sommer | 714/42 |
| 6,724,668 B2 * | 4/2004 | Ohmura et al. | 365/200 |
| 6,728,910 B1 | 4/2004 | Huang | |
| 6,763,480 B2 * | 7/2004 | Harari et al. | 714/8 |
| 6,829,182 B2 * | 12/2004 | Dean | 365/201 |
| 6,877,118 B2 | 4/2005 | Oshima et al. | 714/719 |
| 6,895,537 B2 | 5/2005 | Kawagoe et al. | 714/710 |
| 6,907,385 B2 | 6/2005 | Yasui | 702/184 |

(Continued)

*Primary Examiner* — April Y Blair
*Assistant Examiner* — Dipakkumar Gandhi
(74) *Attorney, Agent, or Firm* — Kenta Suzue; Haynes Beffel & Wolfeld LLP

(57) ABSTRACT

Methods and apparatuses are disclosed in which a repair instruction, such as from a tester, causes an integrated circuit undergoing testing to substitute defective locations of a first set of memory cells in the integrated circuit with a second set of memory cells in the integrated circuit, despite the repair instruction omitting the defective locations of the first set of memory cells of the integrated circuit.

21 Claims, 5 Drawing Sheets

(56) References Cited

U.S. PATENT DOCUMENTS

| | | | |
|---|---|---|---|
| 6,918,072 B2* | 7/2005 | Cowles et al. | 714/711 |
| 2002/0008998 A1* | 1/2002 | Omura et al. | 365/200 |
| 2002/0031025 A1* | 3/2002 | Shimano et al. | 365/201 |
| 2002/0133750 A1* | 9/2002 | Dietrich et al. | 714/30 |
| 2002/0188897 A1* | 12/2002 | Ruckerbauer et al. | 714/710 |
| 2004/0013023 A1* | 1/2004 | Mori et al. | 365/226 |
| 2005/0015539 A1* | 1/2005 | Horii et al. | 711/103 |
| 2005/0024956 A1* | 2/2005 | Tran et al. | 365/200 |
| 2005/0047229 A1 | 3/2005 | Nadeau-Dostie et al. | 365/201 |
| 2005/0128830 A1* | 6/2005 | Nishihara et al. | 365/200 |
| 2006/0031726 A1* | 2/2006 | Zappa et al. | 714/718 |
| 2007/0047347 A1* | 3/2007 | Byun et al. | 365/201 |
| 2007/0053229 A1* | 3/2007 | Iioka et al. | 365/200 |

\* cited by examiner

METHOD AND APPARATUS FOR REPAIRING MEMORY

BACKGROUND

Field of the Invention

The invention relates to integrated circuit memory. In particular, the invention relates to the repair of defective locations of a memory.

SUMMARY

One aspect of the technology is an integrated circuit, with multiple sets of memory cells, and control circuitry (coupled to the sets of memory cells) with an instruction set for controlling the integrated circuit. The multiple sets of memory cells include a first set of memory cells storing data during regular operation of the integrated circuit, a second set of repair memory cells available to substitute for the defective locations of the first set of memory cells, and a third set of memory cells storing defective locations of the first set of memory cells. In some embodiments, at least the first and second sets of memory cells are nonvolatile. In various embodiments, the various sets of memory cells are variously positioned on the same array or on different arrays.

The instruction set of the control circuitry includes at least a repair instruction. The control circuitry is responsive to the repair instruction by substituting the defective locations of the first set of memory cells with the second set of memory cells. The repair instruction omits the defective locations of the first set of memory cells. In some embodiments, this omission decreases the amount of data which must be communicated with the integrated circuit to repair the defective locations of the first set of memory cells.

In some embodiments, the control circuitry is responsive to the repair instruction, by reading the defective locations of the first set of memory cells from the third set of memory cells. In this manner, the control circuitry knows the appropriate locations of the first set of memory cells which must be replaced.

The instruction set of some embodiments of the control circuitry further includes a test instruction. The control circuitry is responsive to the test instruction by detecting whether memory cells of the first set of memory locations meet margin requirements. Further, some embodiments store the defective locations of the first set of memory cells in the third set of memory cells, in response to the test instruction.

Another aspect of the technology is a method of testing integrated circuits in parallel, comprising the step of:

sending a repair instruction from a tester to multiple integrated circuits undergoing testing. Each integrated circuit is responsive to the repair instruction by substituting defective locations of a first set of memory cells in each integrated circuit with a second set of memory cells in each integrated circuit. The repair instruction omits the defective locations of the first set of memory cells of any of the integrated circuits. In some embodiments each integrated circuit is further responsive to the repair instruction, by reading the defective locations of the first set of memory cells from a third set of memory cells in each integrated circuit. Because the repair instruction omits the defective locations of memory which would be specific to each integrated circuit, in some embodiments the same instruction is sent to each integrated circuit.

Some embodiments further include the step of:
sending a test instruction from the tester to the multiple integrated circuits undergoing testing. Each integrated circuit is responsive to the test instruction by detecting whether memory cells of the first set of memory locations meet margin requirements. In some embodiments each integrated circuit is further responsive to the test instruction by storing the defective locations of the first set of memory cells in a third set of memory cells. In some embodiments, the test instruction is sent to prior to sending the repair instruction.

Another aspect of the technology is a method of integrated circuit testing, comprising the steps of:

receiving a repair instruction, from a tester, at an integrated circuit undergoing testing. The integrated circuit is responsive to the repair instruction by substituting defective locations of a first set of memory cells in the integrated circuit with a second set of memory cells in the integrated circuit. The repair instruction omits the defective locations of the first set of memory cells of the integrated circuit. In some embodiments, the integrated circuit is further responsive to the repair instruction, by reading the defective locations of the first set of memory cells from a third set of memory cells in the integrated circuit.

Some embodiments further include the step of:
receiving a test instruction, from the tester, at the integrated circuit undergoing testing. The integrated circuit is responsive to the test instruction by detecting whether memory cells of the first set of memory locations meet margin requirements. In some embodiments the integrated circuit is further responsive to the test instruction by storing the defective locations of the first set of memory cells in a third set of memory cells. In some embodiments, the test instruction is sent to prior to sending the repair instruction.

Other embodiments of the various aspects are as disclosed herein.

DETAILED DESCRIPTION

Figure 1:
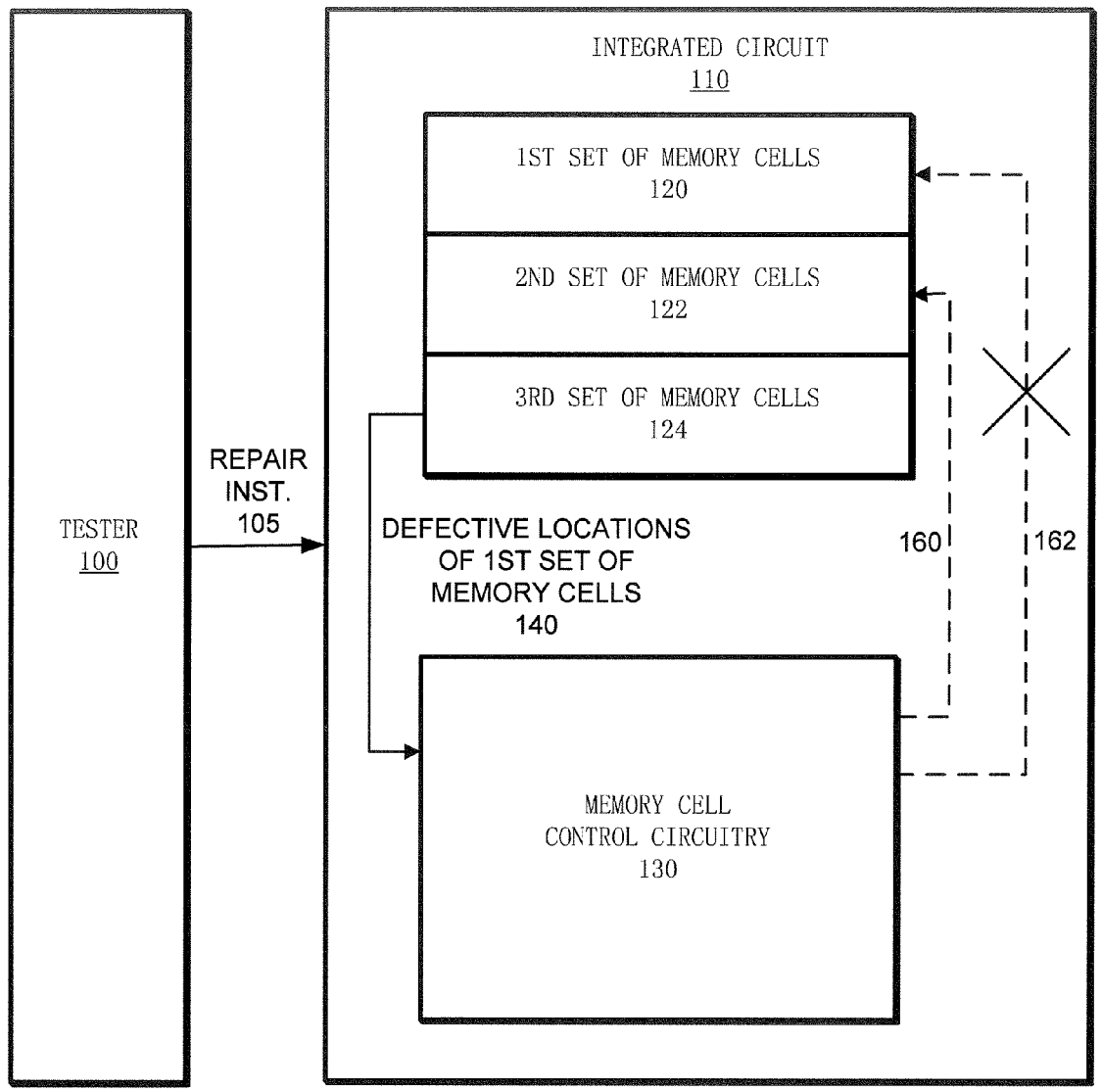
FIG. 1 is a block diagram of a tester sending a repair instruction to an integrated circuit, and the integrated circuit receiving the repair instruction from the tester.

FIG. 1 is a block diagram of a tester sending a repair instruction to an integrated circuit, and the integrated circuit receiving the repair instruction from the tester. A tester 100 sends a repair instruction 105, which is received by an integrated circuit 110. The repair instruction 105 does not specify the defective memory addresses to be repaired. The integrated circuit 110 has several sets of memory cells—$1^{st}$ set 120, $2^{nd}$ set 122, and $3^{rd}$ set 124—coupled to memory cell control circuitry 130. Although the sets of memory cells are shown together, in various embodiments, the sets of memory cells are contiguous, noncontiguous, or selectively contiguous (e.g., $1^{st}$ set 120 and $2^{nd}$ set 122, $2^{nd}$ set 122 and $3^{rd}$ set 124, and $1^{st}$ set 120 and $3^{rd}$ set 124). The repair instruction 105 does not specify the defective memory addresses to be repaired, but the memory cell control circuitry 130 reads out, from the $3^{rd}$ set of memory cells, the locations of defective locations of the $1^{st}$ set of memory cells 120, such as those that failed to meet margin requirements. In various embodiments, the sets of memory cells are all nonvolatile, all volatile, or selectively nonvolatile. The defective locations of the $1^{st}$ set of memory cells 120 are replaced with the $2^{nd}$ set of memory cells 122, as needed. The replacement of addresses is schematically shown by the 'pointers' 160 and 162 from memory cell control circuitry 130 to the sets of memory cells. Addresses pointing to defective locations 162 of the $1^{st}$ set of memory cells 120 are replaced as needed with replacement locations 160 of the $2^{nd}$ set of memory cells 122.

Figure 2:
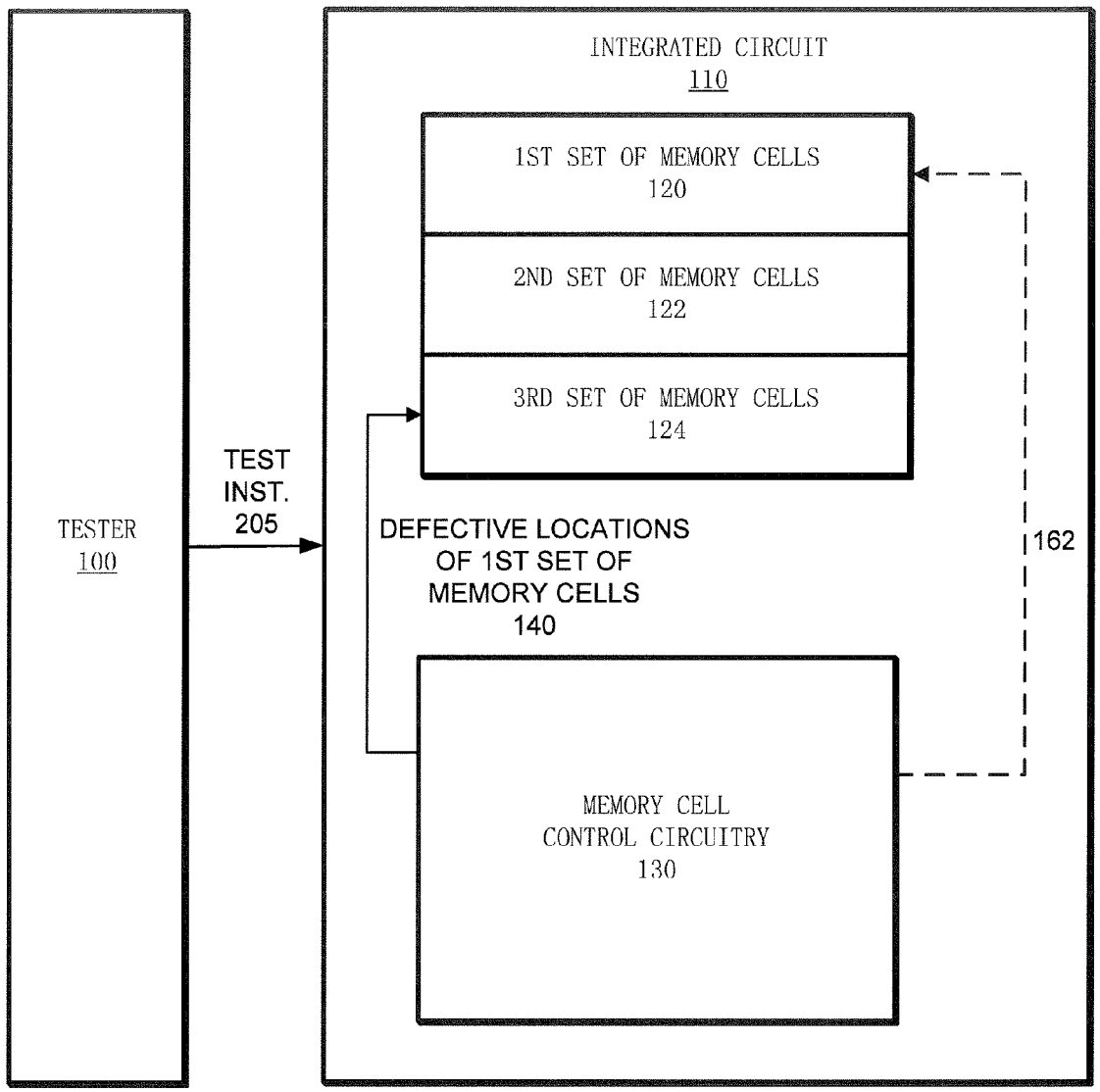
FIG. 2 is a block diagram of a tester sending a test instruction to an integrated circuit, and the integrated circuit receiving the test instruction from the tester.

FIG. 2 is a block diagram of a tester sending a test instruction to an integrated circuit, and the integrated circuit receiving the test instruction from the tester. The test instruction precedes the repair instruction. A tester 100 sends a test instruction 205, which is received by an integrated circuit 110. The memory cell control circuitry 130 tests for defective locations of the $1^{st}$ set of memory cells 120, such as those that fail to meet margin requirements. The defective locations of the $1^{st}$ set of memory cells 120 are stored in the $3^{rd}$ set of memory cells 124. The defective locations of the $1^{st}$ set of memory cells 120 are schematically shown by the 'pointer' 162 from memory cell control circuitry 130 to the $1^{st}$ set of memory cells 120. Addresses pointing to defective locations 162 of the $1^{st}$ set of memory cells 120.

Figure 3:
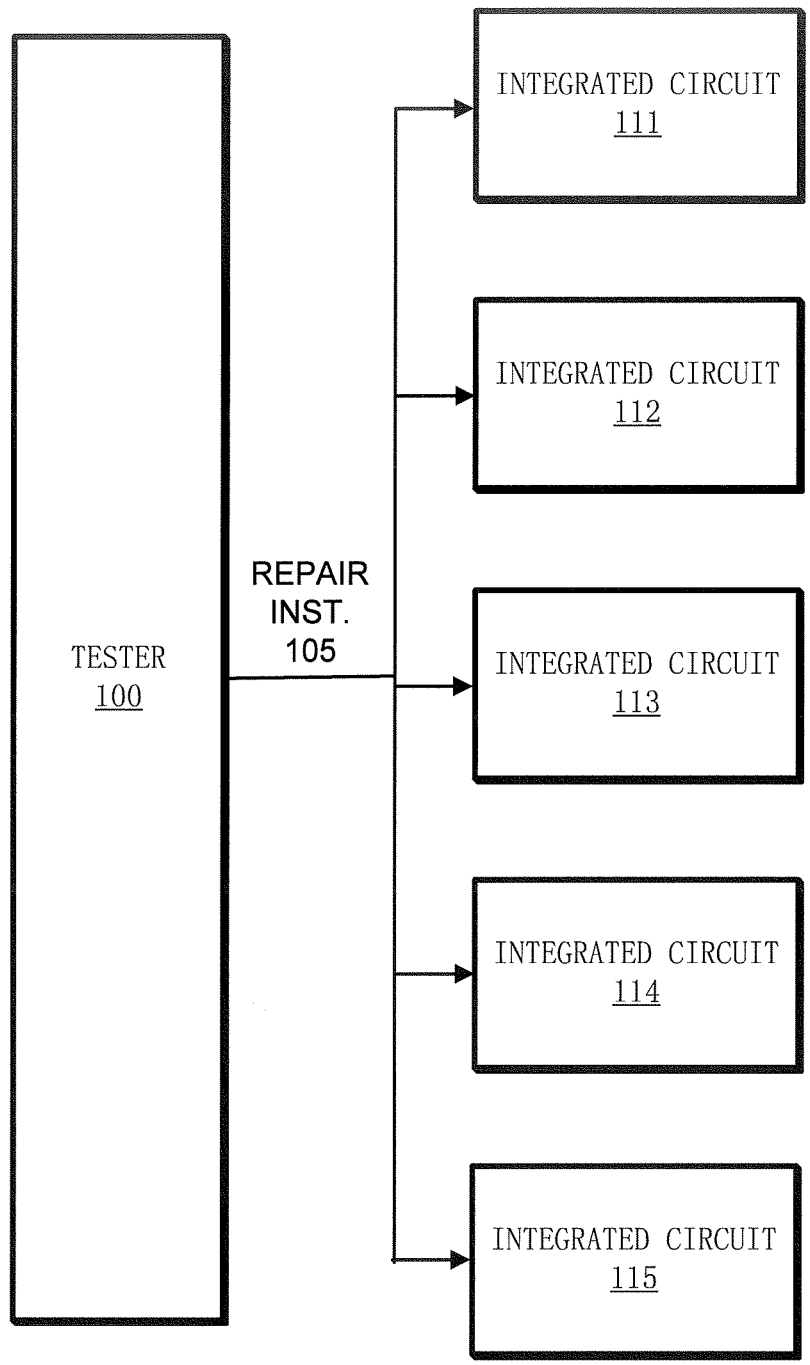
FIG. 3 is a block diagram of a tester sending a repair instruction in parallel to multiple integrated circuits, and the multiple integrated circuits receiving the repair instruction in parallel from the tester.

FIG. 3 is a block diagram of a tester sending a repair instruction in parallel to multiple integrated circuits, and the multiple integrated circuits receiving the repair instruction in parallel from the tester. The repair operation in FIG. 3 resembles the repair operation in FIG. 1, but occurs in parallel across multiple integrated circuits—integrated circuit 111, integrated circuit 112, integrated circuit 113, integrated circuit 114, and integrated circuit 115. Parallel operation is supported by the omission from the repair instruction of the defective locations of the first set of memory cells in each of the integrated circuits.

Figure 4:
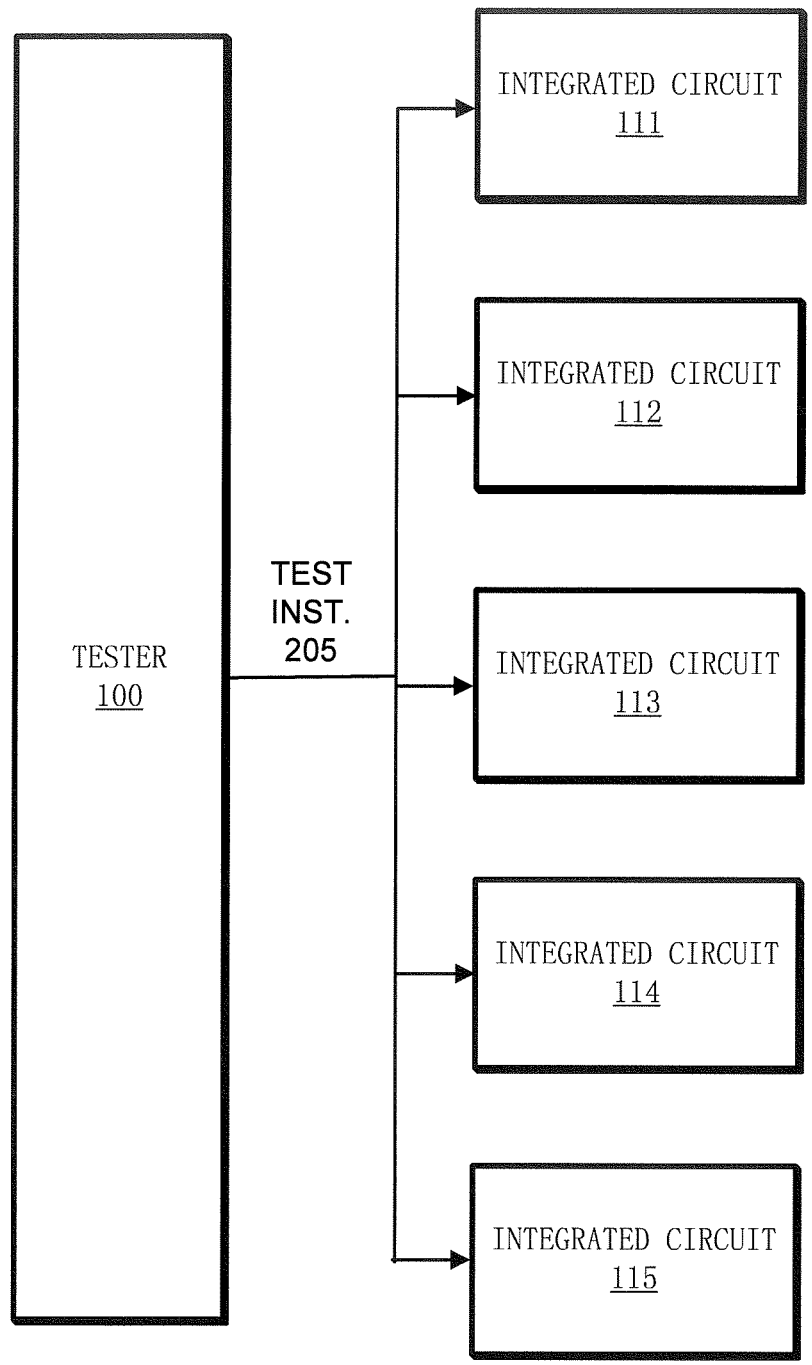
FIG. 4 is a block diagram of a tester sending a test instruction in parallel to an integrated circuit, and the integrated circuit receiving the test instruction in parallel from the tester.

FIG. 4 is a block diagram of a tester sending a test instruction in parallel to an integrated circuit, and the integrated circuit receiving the test instruction in parallel from the tester. The test operation in FIG. 4 resembles the test operation in FIG. 2, but occurs in parallel across multiple integrated circuits—integrated circuit 111, integrated circuit 112, integrated circuit 113, integrated circuit 114, and integrated circuit 115.

Figure 5:
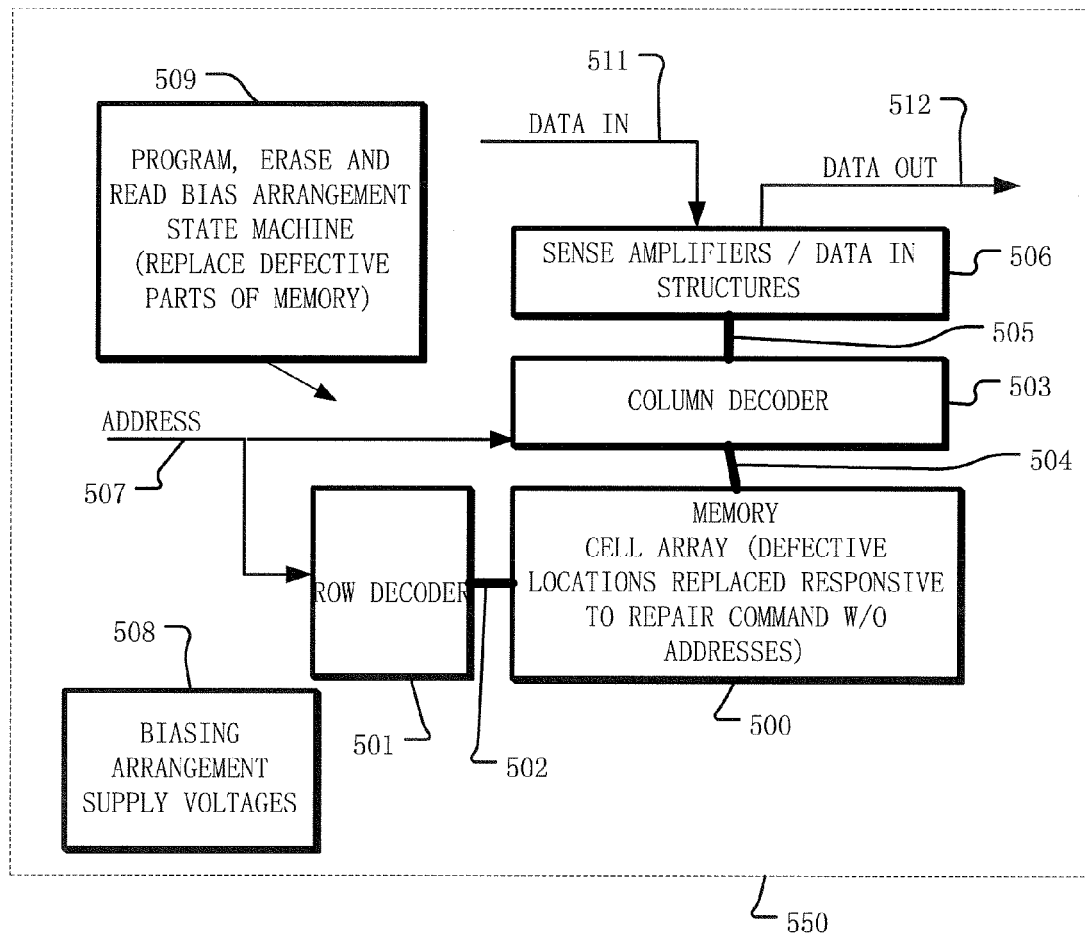
FIG. 5 is a block diagram of an example integrated circuit including control circuitry that replaces defective memory cells in response to a repair instruction that omits the defective locations.

FIG. 5 is a block diagram of an example integrated circuit including control circuitry that replaces defective memory cells in response to a repair instruction that omits the defective locations.

The integrated circuit 550 includes a memory array 500 implemented using memory cells with defective locations that are replaced responsive to a repair command that does not specify the defective addresses. Addresses are supplied on bus 505 to column decoder 503 and row decoder 501. Sense amplifiers and data-in structures in block 506 are coupled to the column decoder 503 via data bus 507. Data is supplied via the data-in line 511 from input/output ports on the integrated circuit 550, or from other data sources internal or external to the integrated circuit 550, to the data-in structures in block 506. Data is supplied via the data-out line 515 from the block 506 to input/output ports on the integrated circuit 550, or to other data destinations internal or external to the integrated circuit 550. The control circuitry 509 also has a program, erase, and read bias arrangement state machine that replaced defective locations of the memory cell array 500.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
    a first set of memory cells storing data during regular operation of the integrated circuit;
    a second set of memory cells available to substitute for defective locations of the first set of memory cells;
    a third set of memory cells storing addresses of defective locations of the first set of memory cells;
    control circuitry responsive to an instruction from a tester outside the integrated circuit to substitute defective cells of the first set of memory cells at the addresses stored in the third set of memory cells, with the second set of memory cells and wherein the instruction omits the defective locations of the first set of memory cells, and wherein the third set of memory cells is in a same memory array with at least one of the first set of memory cells and the second set of memory cells.

2. The integrated circuit of claim 1, wherein the control circuitry is responsive to the instruction, by reading the defective locations of the first set of memory cells from the third set of memory cells.

3. The integrated circuit of claim 1, wherein an instruction set of the control circuitry further includes:
    a test instruction, wherein the control circuitry is responsive to the test instruction by detecting whether memory cells of the first set of memory locations meet margin requirements, and storing the defective locations of the first set of memory cells in the third set of memory cells.

4. The integrated circuit of claim 1, wherein an instruction set of the control circuitry further includes:
    a test instruction, wherein the control circuitry is responsive to the test instruction by detecting whether memory cells of the first set of memory locations meet margin requirements.

5. The integrated circuit of claim 1, wherein communication of the defective locations only within the integrated circuit is sufficient to substitute the defective cells of the first set of memory cells with the second set of memory cells.

6. The integrated circuit of claim 1, wherein the third set of memory cells is in a same memory array with the first set of memory cells.

7. The integrated circuit of claim 1, wherein the third set of memory cells is in a same memory array with the second set of memory cells.

8. A method of testing integrated circuits in parallel, comprising:
    sending a repair instruction from a tester to a plurality of integrated circuits undergoing testing, wherein each of the plurality of integrated circuits includes control circuitry responsive to the repair instruction by substituting defective locations of a first set of memory cells in each of the plurality of integrated circuits at addresses of the defective locations stored in a third set of memory cells, with a second set of memory cells in each of the plurality of integrated circuits, and the repair instruction omits the defective locations of the first set of memory cells of any of the integrated circuits, and wherein the third set of memory cells is in a same memory array with at least one of the first set of memory cells and the second set of memory cells.

9. The method of claim 8, wherein the control circuitry of each of the plurality of integrated circuits is responsive to the instruction, by reading the defective locations of the first set of memory cells from the third set of memory cells in each of the plurality of integrated circuits.

10. The method of claim 8, further comprising:
sending a test instruction from the tester to the plurality of integrated circuits undergoing testing, wherein the control circuitry of each of the plurality of integrated circuits is responsive to the test instruction by storing the defective locations of the first set of memory cells in the third set of memory cells.

11. The method of claim 8, wherein communication of the defective locations only within the integrated circuit is sufficient to substitute the defective cells of the first set of memory cells with the second set of memory cells.

12. The method of claim 8, wherein the third set of memory cells is in a same memory array with the first set of memory cells.

13. The method of claim 8, wherein the third set of memory cells is in a same memory array with the second set of memory cells.

14. A method of integrated circuit testing, comprising:
receiving a repair instruction, from a tester, at an integrated circuit undergoing testing, wherein the integrated circuit includes control circuitry responsive to the repair instruction by substituting defective locations of a first set of memory cells in the integrated circuit at addresses of the defective locations stored in a third set of memory cells, with a second set of memory cells in the integrated circuit, and the repair instruction omits the defective locations of the first set of memory cells of the integrated circuit, and wherein the third set of memory cells is in a same memory array with at least one of the first set of memory cells and the second set of memory cells.

15. The method of claim 14, wherein the control circuitry of the integrated circuit is responsive to the instruction, by reading the defective locations of the first set of memory cells from the third set of memory cells in the integrated circuit.

16. The method of claim 14, further comprising:
receiving a test instruction, from the tester, at the integrated circuit undergoing testing, wherein the control circuitry of the integrated circuit is responsive to the test instruction.

17. The method of claim 14, further comprising
receiving a test instruction, from the tester, at the integrated circuit undergoing testing, wherein the control circuitry of the integrated circuit is responsive to the test instruction by storing the defective locations of the first set of memory cells in the third set of memory cells.

18. The method of claim 14, comprising:
prior to receiving the repair instruction, receiving a test instruction, from the tester, at the integrated circuit undergoing testing, wherein the control circuitry of the integrated circuit is responsive to the test instruction by storing the defective locations of the first set of memory cells in the third set of memory cells.

19. The method of claim 14, wherein communication of the defective locations only within the integrated circuit is sufficient to substitute the defective cells of the first set of memory cells with the second set of memory cells.

20. The method of claim 14, wherein the third set of memory cells is in a same memory array with the first set of memory cells.

21. The method of claim 14, wherein the third set of memory cells is in a same memory array with the second set of memory cells.

* * * * *